United States Patent [19]

Akiyama et al.

[11] Patent Number: 5,943,595
[45] Date of Patent: Aug. 24, 1999

[54] METHOD FOR MANUFACTURING A SEMICONDUCTOR DEVICE HAVING A TRIPLE-WELL STRUCTURE

[75] Inventors: Yukiharu Akiyama, Fukuyama; Toshiyuki Matsushima; Shinichi Sato, both of Nara, all of Japan

[73] Assignee: Sharp Kabushiki Kaisha, Osaka, Japan

[21] Appl. No.: 09/028,570

[22] Filed: Feb. 24, 1998

[30] Foreign Application Priority Data

Feb. 26, 1997 [JP] Japan .................................. 9-041799

[51] Int. Cl.⁶ .................................................. H01L 21/425
[52] U.S. Cl. .......................... 438/527; 438/530; 438/546; 438/223; 438/232
[58] Field of Search ...................... 438/529, 530, 438/220, 370, 414, 223, 224, 227, 228, 231, 232, 305, 307, 306, 369, 374, 458, 509, 514, 519, 521, 527, 546, 549, 526

[56] References Cited

U.S. PATENT DOCUMENTS

| | | | |
|---|---|---|---|
| 4,332,627 | 6/1982 | Schmitt et al. | 438/527 |
| 4,590,666 | 5/1986 | Goto | 438/369 |
| 4,769,337 | 9/1988 | Maeda | 438/208 |
| 5,156,989 | 10/1992 | Williams et al. | 438/220 |
| 5,242,841 | 9/1993 | Smayling et al. | 438/307 |
| 5,648,281 | 7/1997 | Williams et al. | 438/369 |
| 5,677,209 | 10/1997 | Shon et al. | 438/370 |
| 5,679,587 | 10/1997 | Zambrano | 438/357 |
| 5,716,887 | 2/1998 | Kim | 438/370 |

FOREIGN PATENT DOCUMENTS

5-283629  10/1993  Japan .

*Primary Examiner*—Charles Bowers
*Assistant Examiner*—Jack Chen
*Attorney, Agent, or Firm*—Nixon & Vanderhye P.C.

[57] ABSTRACT

A method of manufacturing a semiconductor device having a triple-well structure, includes the steps of: forming a first well layer of a second conductivity type by implanting, as a first ion implantation, impurity ions of the second conductivity type to a specific depth from the surface of a semiconductor substrate of a first conductivity type and then subjecting the semiconductor substrate to an annealing treatment; forming a second ion-implanted region by implanting, as a second ion implantation, impurity ions of the second conductivity type into an end portion of first well layer with a specific width and at a depth from the surface of the semiconductor substrate to the surface of the first well layer to surround the first well layer; forming a third ion-implanted region by implanting, as a third ion implantation, impurity ions of the first conductivity type into a portion of the semiconductor substrate surrounded by the first well layer and the second ion-implanted region and at depth from the surface of the semiconductor surface to the surface of the first well layer; forming a second well layer and a third well layer by an annealing treatment of the second ion-implanted region and the third ion-implanted region after the second ion implantation and the third ion implantation respectively, or after the third ion implantation simultaneously.

18 Claims, 7 Drawing Sheets

| N⁺ diffusion layer 17 (E) | PW15b (B) | NW14(N⁺) (C) |
|---|---|---|

METHOD FOR MANUFACTURING A SEMICONDUCTOR DEVICE HAVING A TRIPLE-WELL STRUCTURE

CROSS-REFERENCE TO RELATED APPLICATIONS

This application is related to Japanese application No. Hei 9 (1997)-041799, filed on Feb. 26, 1997 whose priority is claimed under 35 USC § 119, the disclosure of which is incorporated by reference in its entirety.

BACKGROUND OF THE INVENTION

1. Field of the Invention

The present invention relates to a method for manufacturing a semiconductor device. More particularly, it relates to a method for manufacturing a semiconductor device having a triple-well structure to be used for a flash memory and the like to erase data by applying a negative bias.

2. Related Arts

A conventional method for manufacturing a typical semiconductor device having a triple-well structure is disclosed in, for example, Japanese Unexamined Patent Publication No. Hei 5 (1993)-283629. Hereafter, this conventional method is described with reference to FIGS. 5(a) to 5(c) and FIGS. 6(a) to 6(c).

First, a resist mask 12a is formed on a surface of a p-type silicon substrate 11 as a mask for forming an n-type well layer 13. A first ion implantation of phosphorus ions into the p-type silicon substrate 11 is then carried out with an implantation energy of 120 KeV in a dose of $6 \times 10^{12}$ cm$^{-2}$ (FIG. 5(a)). After removal of the resist mask 12a, the silicon substrate 11 is subjected to an annealing treatment at 1150° C. for 20 hours to form the n-type well layer 13 (FIG. 5(b)). At this stage, the depth of the n-type well layer 13 is about 6 µm and the impurity concentration in the surface of the n-type well layer 13 is about $1 \times 10^{16}$ to $2 \times 10^{16}$ cm$^{-3}$.

Figure 5A:
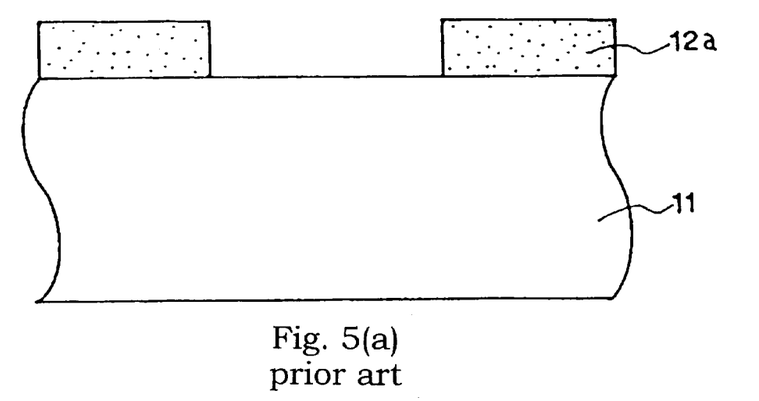
FIGS. 5(a) to 5(c) are schematic sectional views illustrating a manufacturing steps for a semiconductor device according to the conventional method.
Figure 5B:
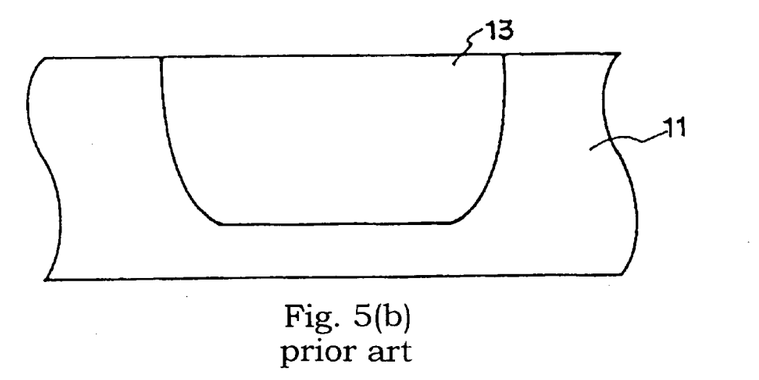
Figure 5C:
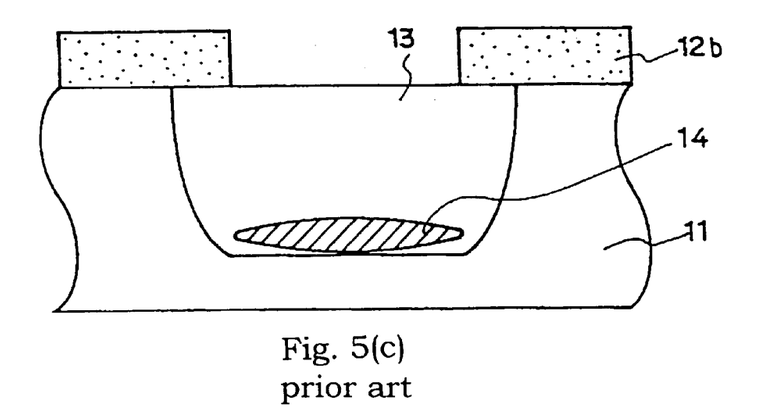

Next, in order to form an n-type well layer 14 having a high impurity concentration, a resist mask 12b is formed having the same pattern as the resist mask 12a used in the process of the first ion implantation. Then, a second ion implantation of phosphorus ions into the n-type well layer 13 is carried out with an implantation energy of 8 MeV in a dose of $1 \times 10^{13}$ cm$^{-2}$. The n-type well layer 14 having an high impurity concentration is formed in the previously formed n-type well layer 13 at a depth of 5 to 6 µm from the surface of the p-type silicon substrate 11 (FIG. 5 (c)). Then, the resist mask 12b is removed.

Next, a resist mask 12c is formed as a mask to form a p-type well layer. Then, a third ion implantation of boron ions is carried out into the n-type well layer 13. The third ion implantation of boron ions is carried out four times with an implantation energy of 140 KeV, 340 KeV, 600 KeV and 800 KeV each in a constant dose of $2 \times 10^{12}$ cm$^{-2}$ to form a boron implanted region 15a having a multi-layer structure in the n-type well layer 13. The boron implanted region 15a having the multi-layer structure has a peak concentration of the implanted boron at a depth of 0.4 µm, 0.8 µm, 1.2 µm and 1.6 µm (FIG. 6(a)).

Figure 6A:
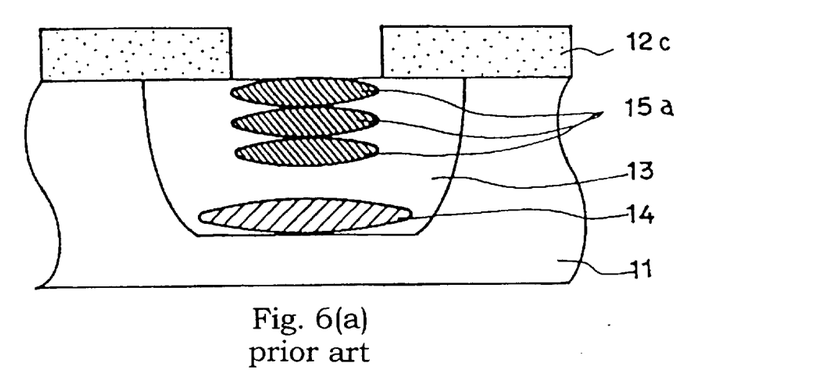
FIGS. 6(a) to 6(c) are schematic sectional views illustrating the manufacturing steps for the semiconductor device according to the conventional method.
Figure 6B:
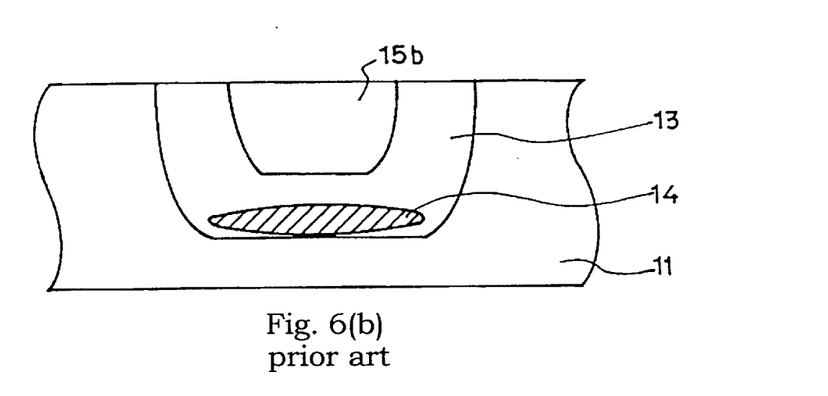
Figure 6C:
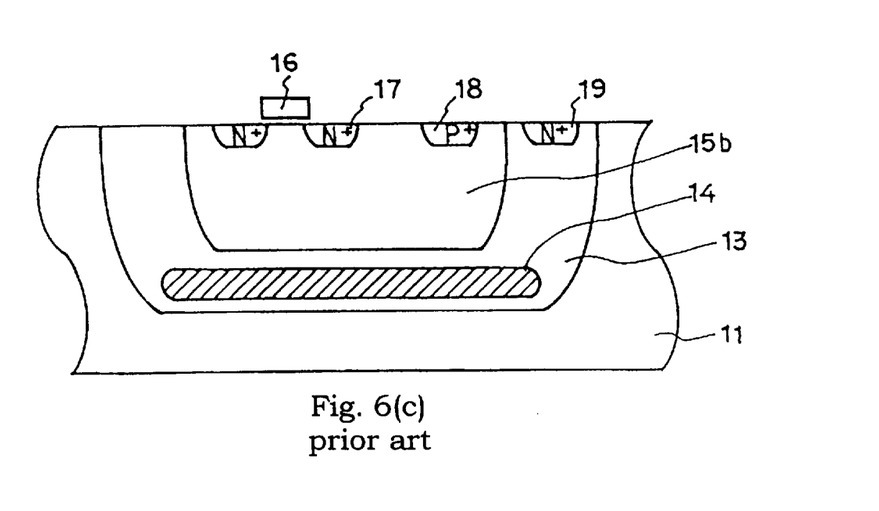

The resist mask 12c is then removed and an annealing treatment is carried out, for example, at 1100° C. for 10 hours to form the p-type well layer 15b, thereby providing a semiconductor device of a triple-well structure (FIG. 6(b)).

Thereafter, an n$^+$-type diffusion layer 17 is formed as a source/drain constituting a transistor in the surface layer of the p-type well layer 15b, and a gate 16 is formed over a channel region between the source and the drain. Further, a terminal 18 adding a bias to the formed p-type well layer 15b and a terminal adding a bias 19 to the formed n-type well layer 13 are formed in the surface layer of the p-type well layer 15b and the n-type well layer 13, respectively (FIG. 6(c)).

The semiconductor device having the conventional triple-well structure mentioned above has problems described below.

Figure 7:
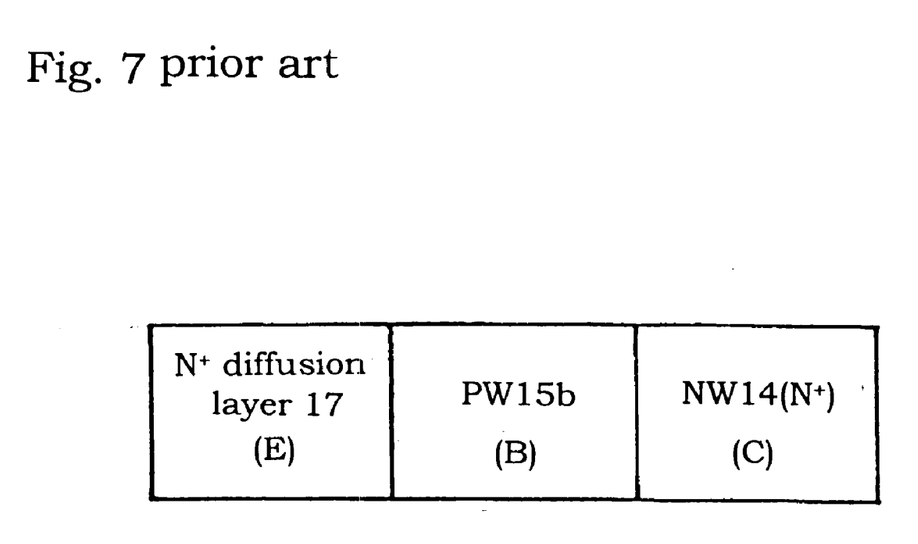
FIG. 7 is a model view of a parasitic bipolar transistor existing in a conventional semiconductor device.

First, in the case that a peak impurity concentration is high in the n-type well layer 14, there will be a decrease in a voltage (hereafter referred to as a breakdown voltage of on-state (BV on)) at which the elements constituting the semiconductor device start to operate as a parasitic bipolar transistor. The operation principle of the parasitic bipolar transistor is described with reference to FIG. 7. When an inverse voltage is applied between the n-type well layer 14 and the p-type well layer 15b and a noise of a forward bias is applied between the n$^+$-type diffusion layer 17 and the p-type well layer 15b, the n$^+$-type diffusion layer 17 functions as an emitter, the p-type well layer 15b functions as a base and the n-type well layer 14 functions as a collector. A set of the emitter, the base and the collector is called as the parasitic bipolar transistor. In this case, when the inverse voltage applied between the n-type well layer 14 and the p-type well layer 15b is larger than the BV on, a breakdown current flows inside each well layer. This break-down current could destroy the transistor formed on the surface of the p-type well layer 15b.

On the other hand, when a dose of ion implantation is decreased in order to lower the impurity concentration in the n-type well layer 14, a sheet resistance of the n-type well layer 14 increases. Also, when a concentration of the impurity in the n-type well layer 14 is low, a punch-through occurs between the p-type well layer 15b and the p-type silicon substrate 11. Therefore, it is necessary to precisely control a distribution of the impurity concentration in the n-type well layer 14.

However, in the conventional method, an annealing treatment is conducted at a high temperature for a long time to form the n-type well layer 13 and a drive-in diffusion treatment is conducted at a high temperature for a long time to form the p-type well layer 15b and to optimize an impurity concentration in the n-type well layer 14. Accordingly, the concentration of the n-type well layer 14 can be optimized but, at the same time, the n-type well layer 14 and the p-type well layer 15b spread horizontally, so that a whole well area becomes broader. Therefore, it is difficult to achieve size reduction of a peripheral circuit.

Figure 4A:
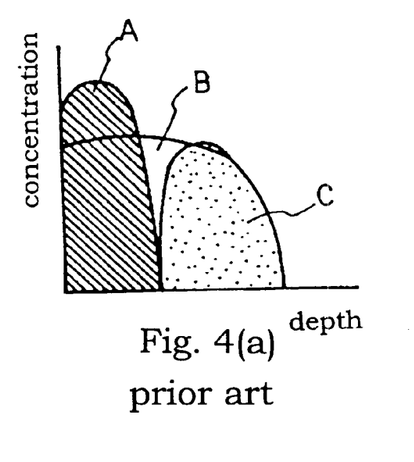
FIG. 4(a) is a distribution of an impurity concentration of a conventional semiconductor device and FIG. 4(b) is a distribution of an impurity concentration of a semiconductor device according to the present invention.

Second, in the conventional method, since the p-type well layer 15b is formed in the previously formed n-type well layer 13, the p-type impurity ions need to be implanted at a sufficiently high concentration for canceling the conductivity of the n-type well layer 13 in order to form the p-type well layer 15b as shown in FIG. 4(a). Accordingly, there is a problem such that the impurity concentration in the surface of the silicon substrate 11 becomes high. In FIG. 4(a), symbol A represents a distribution of the impurity concentration in the p-type well layer 15b, symbol B represents a distribution of the impurity concentration in the n-type well layer 13 and symbol C represents a distribution of the impurity concentration in the n-type well layer 14.

Figure 3:
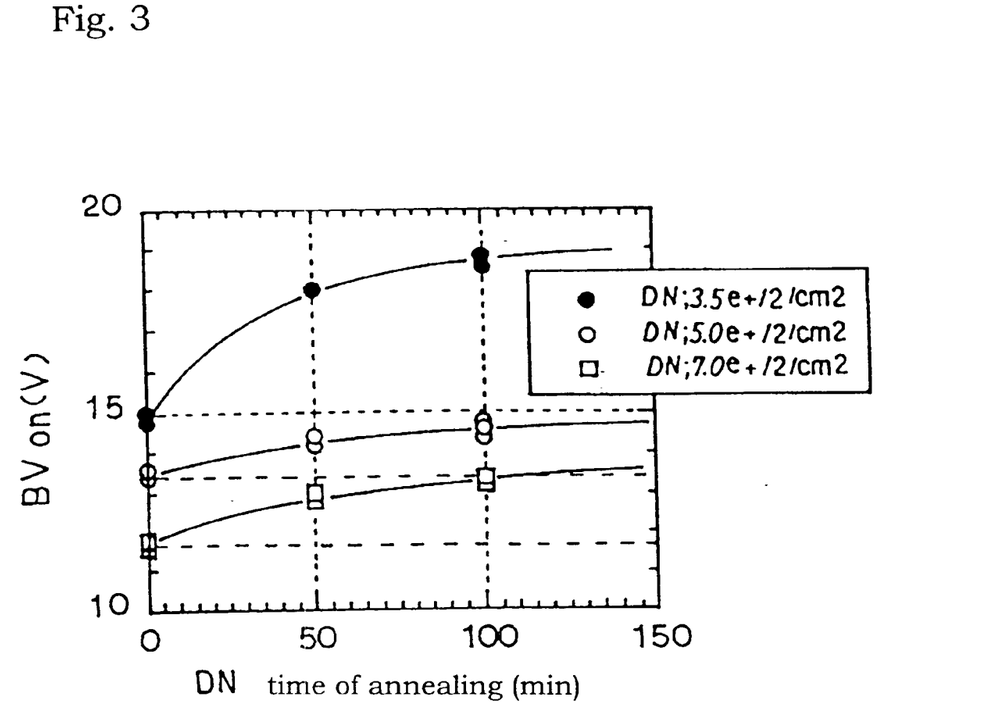
FIG. 3 is a graph illustrating a relationship between an annealing time for forming an n-type well layer 14 and a BV on of the semiconductor device according to the conventional method.

Third, in order to suppress the operation of the parasitic bipolar transistor, it is necessary to achieve a high BV on. To this end, it is necessary to anneal at a high temperature for a long time after the ion implantation, as is apparent from FIG. 3 showing a relationship between an annealing time for forming the n-type well layer 14 and the BV on.

However, a well area becomes broader if the annealing is conducted at a high temperature for a long time, so that it is difficult to achieve size reduction of a peripheral circuit.

SUMMARY OF THE INVENTION

Thus, present invention provides the method of manufacturing a semiconductor device having a triple-well structure, comprising the steps of:

forming a first well layer of a second conductivity type by implanting, as a first ion implantation, impurity ions of the second conductivity type to a specific depth from the surface of a semiconductor substrate of a first conductivity type and then subjecting the semiconductor substrate to an annealing treatment;

forming a second ion-implanted region by implanting, as a second ion implantation, impurity ions of the second conductivity type into an end portion of first well layer with a specific width and at a depth from the surface of the semiconductor substrate to the surface of the first well layer to surround the first well layer;

forming a third ion-implanted region by implanting, as a third ion implantation, impurity ions of the first conductivity type into a portion of the semiconductor substrate surrounded by the first well layer and the second ion-implanted region and at depth from the surface of the semiconductor surface to the surface of the first well layer;

forming a second well layer and a third well layer by an annealing treatment of the second ion-implanted region and the third ion-implanted region after the second ion implantation and the third ion implantation respectively, or after the third ion implantation simultaneously.

DETAILED DESCRIPTION OF THE PREFERRED EMBODIMENTS

First, a silicon substrate is generally used as a semiconductor substrate in the present invention. In the present invention, a first conductivity type means a p-type or an n-type. A second conductivity type means an n-type in the case that the first conductivity type is a p-type, and a p-type in the case that the first conductivity type is an n-type. Phosphorous or the like can be used as an impurity to give a conductivity of an n-type, and boron or the like can be used as an impurity to give a conductivity of a p-type.

The semiconductor substrate used in the present invention has a first conductivity type. An impurity concentration providing the silicon substrate with the first conductivity type is preferably about $1 \times 10^{14}$ to about $1 \times 10^{15}$ cm$^{-3}$.

Impurity ions of a second conductivity type are implanted into the semiconductor substrate at a specific depth from the surface of the semiconductor substrate (first ion implantation). The first ion implantation is preferably carried out under such condition that an implantation energy is about 2 to about 4 MeV and a dose is about $1.0 \times 10^{12}$ to about $1.0 \times 10^{13}$ cm$^{-2}$. A resist mask may be formed on the semiconductor substrate to make a specific region open to implant the first ion into the specific region. After removal of the resist mask, the semiconductor substrate is subjected to an annealing treatment. This annealing treatment is preferably carried out at about 1000 to about 1200° C. for about 80 to about 120 minutes. By this annealing treatment, a first well layer of the second conductivity type can be formed at a region of about 1.5 to about 4.0 μm depth. Moreover, this annealing treatment is preferably carried out so that a peak of impurity concentration in the first well layer is existing at the region of about 2.5 μm depth. An impurity concentration in the first well layer is preferably about $8 \times 10^{15}$ to about $5 \times 10^{16}$ cm$^{-3}$. A surface shape of the first well is not limited and may be appropriately chosen depending on a desired performance of the semiconductor device.

The annealing treatment of the first well layer may also serve as an annealing treatment to form a field oxide film on the semiconductor substrate for device isolation. This can reduce the number of steps for manufacturing the device.

Next, impurity ions of the second conductivity type are implanted into an end portion of first well layer with a specific width and at a depth from the surface of the semiconductor substrate to the surface of the first well layer to surround the first well layer (second ion implantation), thereby a second ion implanted region is formed.

This second ion implantation is preferably carried out for plural times at various implantation energies. Since the second ion implantation is carried out for plural times, the second ion-implanted region can be formed which has a multi-layer structure and therefore, a later-performed annealing treatment for forming a second well layer can be carried out in a short time. Here, "plural times" corresponds to 1 time or more, preferably 3 times.

For example, in the case that the second ion implantation is carried out three times, the condition of the second ion implantation may be a dose of about $1.0 \times 10^{12}$ to about $5.0 \times 10^{12}$ cm$^{-2}$ with an implantation energy of about 150 to about 250 KeV, a dose of about $1.0 \times 10^{12}$ to about $5.0 \times 10^{12}$ cm$^{-2}$ with an implantation energy of about 850 to about 950 KeV and a dose of about $1.0 \times 10^{12}$ to about $1.0 \times 10^{13}$ cm$^{-2}$ with an implantation energy of about 1.0 MeV to about 2.0 MeV. A preferred condition of the second ion implantation is a dose of about $2.0 \times 10^{12}$ cm$^{-2}$ with an implantation energy of about 200 KeV, a dose of about $2.0 \times 10^{12}$ cm$^{-2}$ with an implantation energy of about 900 KeV and a dose of about $4.0 \times 10^{12}$ cm$^{-2}$ with an implantation energy of about 1.5 MeV.

In order to implant the second ions with a specific width on the end portion of the surface of the first well layer, a resist mask may be formed which is open with the specific width on the surface of the semiconductor substrate.

Next, a third ion-implanted region is formed by implantation of impurity ions of the first conductivity type (third ion implantation) into a portion of the semiconductor substrate surrounded by the first well layer and the second ion-implanted region and at a depth from the surface of the semiconductor substrate to the surface of the first well layer.

This third ion implantation is preferably carried out for plural times at various implantation energies. Since the third ion implantation is carried out for plural times, the third ion-implanted region can be formed which has a multi-layer structure and therefore, a later-performed annealing treatment for forming a third well layer can be carried out in a short time. Here, "plural times" corresponds to 1 time or more, preferably 3 times.

For example, in the case that the third ion implantation is carried out three times, the condition of the third ion implantation may be a dose of about $1.0 \times 10^{12}$ to about $5.0 \times 10^{12}$ cm$^{-2}$ with an implantation energy of about 100 to about 150 KeV, a dose of about $1.0 \times 10^{12}$ to about $1.0 \times 10^{13}$ cm$^{-2}$ with an implantation energy of about 250 to about 350 KeV and a dose of about $1.0 \times 10^{12}$ to about $1.0 \times 10^{13}$ cm$^{-2}$ with an implantation energy of about 550 to about 650 KeV. A preferred condition of the third ion implantation is a dose of about $3.0 \times 10^{12}$ cm$^{-2}$ with an implantation energy of about 120 KeV, a dose of about $5.0 \times 10^{12}$ cm$^{-2}$ with an implantation energy of about 300 KeV and a dose of about $5.0 \times 10^{12}$ cm$^{-2}$ with an implantation energy of about 600 KeV.

In order to implant the third ions into the region surrounded by the first well layer and the second ion-implanted region, a resist mask which is open to this region may be formed on the surface of the semiconductor substrate.

The above-mentioned second ion-implanted region and the third ion-implanted region are subjected to an annealing treatment to turn them into a second well layer and a third well layer, respectively. As a result, a semiconductor device having a triple-well structure is formed. Here, the second well layer and the third well layer may be formed by annealing after the second ion implantation and the third ion implantation, respectively. Alternatively, the second well layer and the third well layer may be formed at the same time by annealing after the third ion implantation. It is preferable if the annealing treatment for forming the second well layer and the third well layer is conducted only once after the third ion implantation, because the number of annealing treatments can be reduced.

For forming the second well layer, the annealing treatment is preferably conducted at about 950 to about 1100° C. for about 4 to about 6 hours. On the other hand, for forming the third well layer, the annealing treatment is preferably conducted at about 950 to about 1100° C. for about 4 to about 6 hours. For forming the second well layer and the third well layer at the same time, the annealing treatment is preferably conducted at about 950 to about 1100° C. for about 4 to about 6 hours.

The formed second well layer and the formed third well layer preferably have an impurity concentration of about $1 \times 10^{16}$ to about $5 \times 10^{17}$ cm$^{-3}$ and about $1 \times 10^{16}$ to about $5 \times 10^{17}$ cm$^{-3}$, respectively.

Then, by a known method, a peripheral circuit portion (e.g., MOS transistor) or a memory cell array may be formed on the semiconductor substrate.

EXAMPLES

In order to illustrate the present invention in detail, Examples are now given, which are in no ways limitative of the present invention.

Figure 4B:
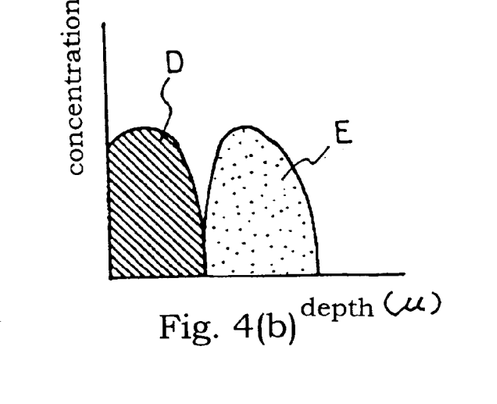

FIGS. 1(a) to 1(c) and FIGS. 2(a) and 2(b) are schematic views illustrating manufacturing steps for a semiconductor device having a triple-well structure according to the present invention. FIG. 4(b) is a distribution of an impurity concentration of the semiconductor device manufactured according to the present invention. In FIGS. 1(a) to 1(c) and FIGS. 2(a) and 2(b), reference numeral 1 represents a p-type silicon substrate, 2a, 2b and 2c each represent a resist mask, 3 represents an n-type first well layer of high concentration, 4a represents a second ion-implanted region, 4b represents an n-type second well layer, 5a represents a third ion-implanted region and 5b represents a p-type third well layer.

The manufacturing steps for the semiconductor device of Example 1 according to the present invention are described with reference to FIGS. 1(a) to 1(c) and FIGS. 2(a) and 2(b).

First, the resist mask 2a was formed by a conventional method on the p-type silicon substrate 1 as a mask to form the n-type first well layer 3. Then, the first ion implantation of phosphorus ions was carried out into the p-type silicon substrate 1 with an implantation energy of 3 MeV in a dose of $5 \times 10^{12}$ cm$^{-2}$ by means of a high energy implantation apparatus (FIG. 1(a)). After that, the resist mask 2a was removed.

Next, a LOCOS oxidation for device isolation in a peripheral circuit portion was carried out at 1100° C. for 100 minutes to form a LOCOS oxide film of 5000 Å. The n-type first well layer 3 of high concentration was formed by a drive-in diffusion of the implanted phosphorus ions carried out simultaneously with the LOCOS oxidation. By this drive-in diffusion, the first well layer 3 was allowed to have a specific concentration distribution along a depth direction (FIG. 1(b)). At this stage, the peak of concentration in the first well layer 3 was placed at a depth of 2.5 μm from the surface of the silicon substrate.

Next, after carrying out the device isolation in a memory cell array by a conventional method, the resist mask 2b was formed as a mask to form the n-type second well layer 4b. Then, the phosphorus ions were implanted for plural times by means of the high energy implantation apparatus to form the second ion-implanted region 4a having a multi-layer structure between the surface of the first well layer 3 and the surface of the p-type silicon substrate 1 (FIG. 1(c)).

Figure 1A:
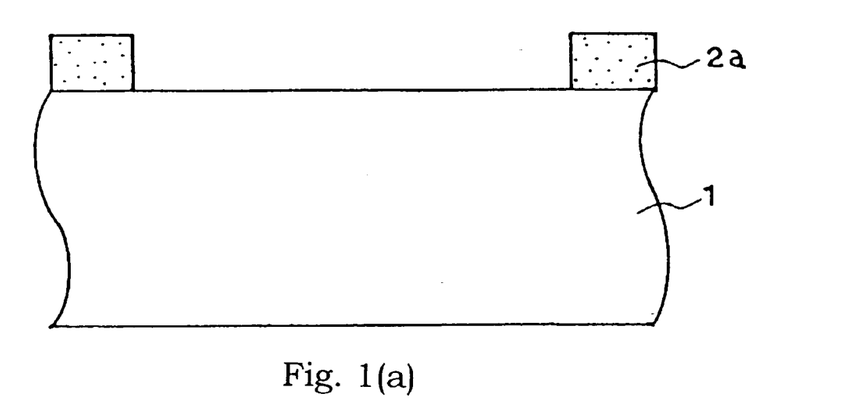
FIGS. 1(a) to 1(c) are schematic sectional views illustrating manufacturing steps for a semiconductor device according to the present invention.
Figure 1B:
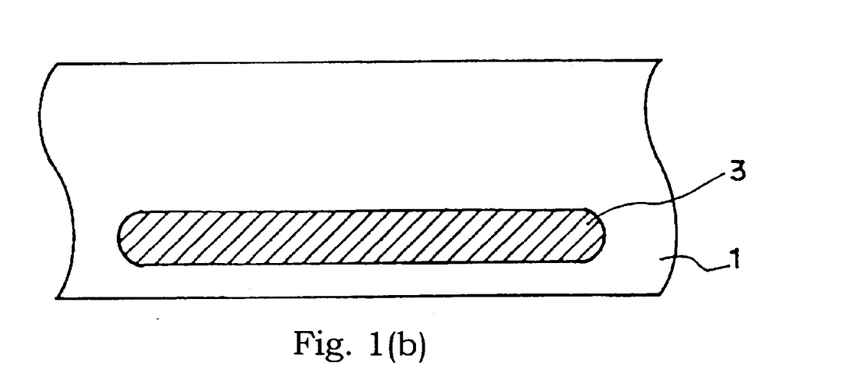
Figure 1C:
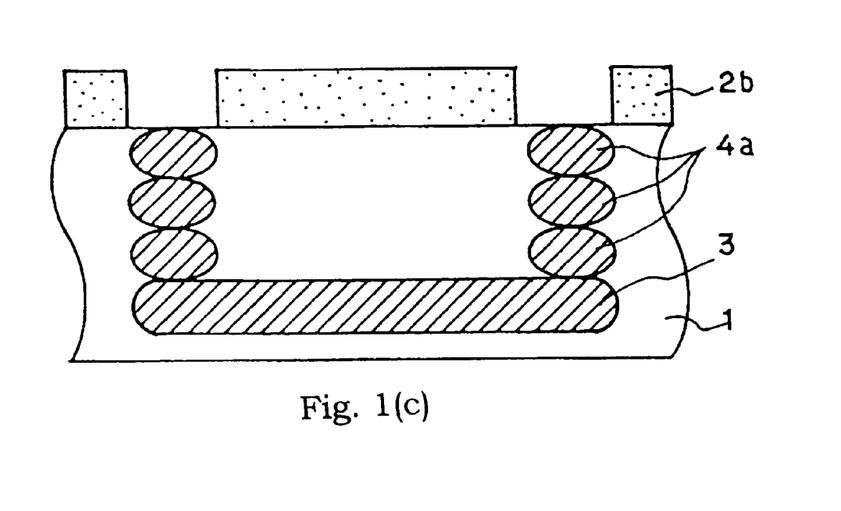
Figures 2A, 2B:
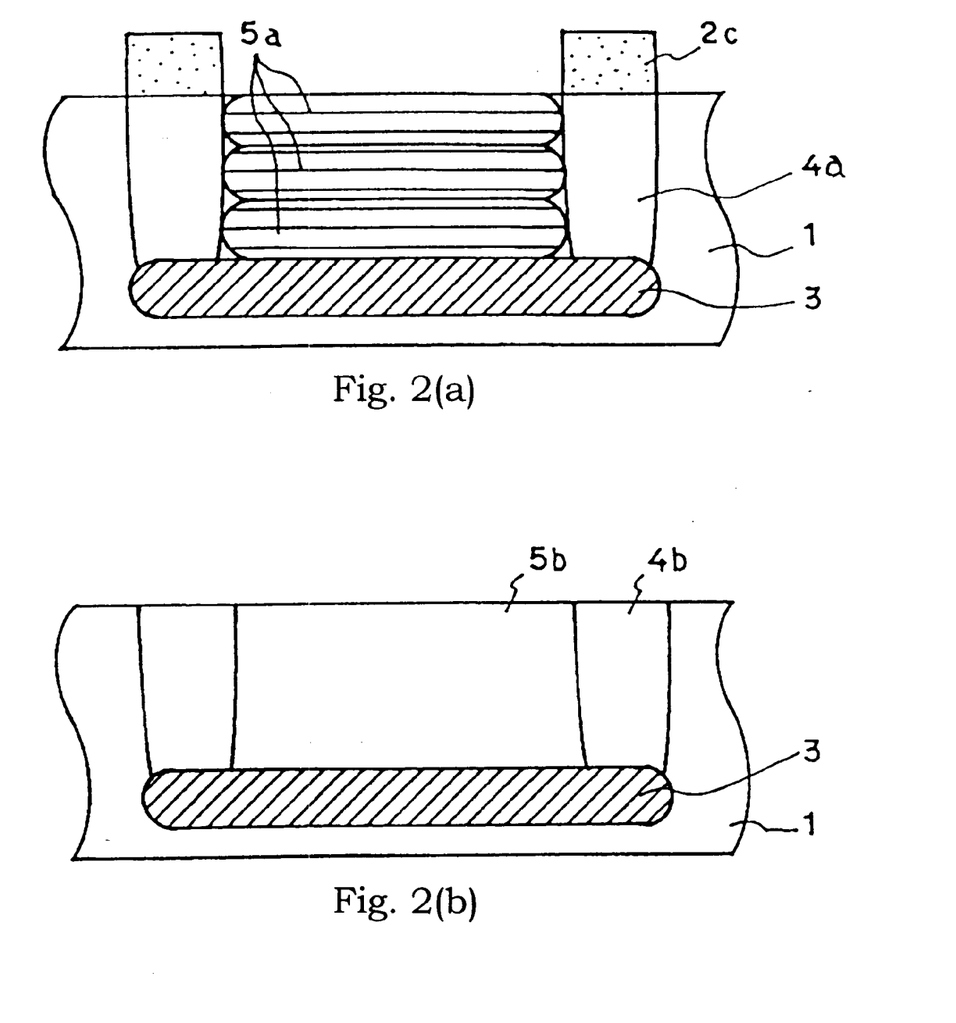
FIGS. 2(a) and 2(b) are schematic sectional views illustrating the manufacturing steps for the semiconductor device according to the present invention.

Specifically, the first ion implantation was carried out in a dose of $2 \times 10^{12}$ cm$^{-2}$ and with an implantation energy of 200 KeV; the second ion implantation was in a dose of $2 \times 10^{12}$ cm$^{-2}$ and with an implantation energy of 900 KeV; and the third ion implantation was in a dose of $4 \times 10^{12}$ cm$^{-2}$ and with an implantation energy of 1.5 MeV. Then, the resist mask 2b was removed.

Next, the resist mask 2c was formed as a mask to form the p-type third well layer 5b. Then, boron ions were implanted for plural times by means of the high energy implantation apparatus to form the third ion-implanted region 5a having a multi-layer structure (FIG. 2(a)). Specifically, the first ion implantation was carried out in a dose of $3 \times 10^{12}$ cm$^{-2}$ and with an implantation energy of 120 KeV; the second ion implantation was in a dose of $1.5 \times 10^{12}$ cm$^{-2}$ and with an implantation energy of 300 KeV; and the third ion implantation was in a dose of $5 \times 10^{12}$ cm$^{-2}$ and with an implantation energy of 600 KeV.

After removal of the resist mask 2c, an annealing treatment was carried out at 1025° C. for 5 hours. By this anealing treatment, the n-type second well layer 4b from the surface of the first well layer 3 to the surface of the silicon substrate 1 was formed and, at the same time, the p-type third well layer 5b was formed in the region surrounded by the second well layer 4b (FIG. 2(b)). Further, an N-channel type MOS transistor was formed in the third well layer 5b by a known method.

FIG. 4(b) shows a concentration distribution in the silicon substrate of the semiconductor device manufactured in accordance with the above mentioned processes. As is apparent from FIG. 4(b), the impurity concentration in the surface of the silicon substrate manufactured in accordance with the present invention could be suppressed and was lower compared with the one manufactured by a conventional technique (shown in FIG. 4(a)). In FIG. 4(b), symbol D represents a distribution of the impurity concentration in the third well layer 5b and symbol E represents a distribution of the impurity concentration in the first well layer 3.

As detailed above, according to the manufacturing method of the present invention, the first well layer having a best impurity distribution for suppressing a parasitic bipolar transistor phenomenon and a punch-through phenomenon can be formed independently without affecting the other well layers. Moreover, the second well layer and the third well layer can be formed without carrying out an annealing treatment at a high temperature for a long time if the second ion-implanted region and the third ion-implanted region are formed by performing an ion implantation for plural times. As a result, horizontal spread of the well layers can be suppressed. Accordingly, an area of a peripheral circuit portion or the like formed on the semiconductor substrate having a triple-well structure can be decreased.

Also, since the conductivity type of the third well layer and that of the semiconductor substrate are the same, the impurity concentration in the surface of the silicon substrate can be lowered. Therefore, a threshold of the transistor formed in the third well layer can be controlled easily.

Moreover, the number of steps can be decreased in the case that an annealing treatment for forming the first well layer serves as the heat treatment for forming the device isolation region.

What is claimed is:

1. A method of manufacturing a semiconductor device having a triple-well structure, comprising the steps of:

forming a buried first well layer of a second conductivity type by implanting, as a first ion implantation, impurity ions of the second conductivity type into a semiconductor substrate of a first conductivity type to form a first ion-implanted region and then subjecting the semiconductor substrate to an annealing treatment to diffuse the impurities in the first ion-implanted region;

forming a second ion-implanted region by implanting, as a second ion implantation, impurity ions of the second conductivity type into the semiconductor substrate, wherein the second ion-implanted region and the first well layer surround a portion of the semiconductor substrate and the second ion implantation is carried out more than once;

forming a third ion-implanted region by implanting, as a third ion-implantation, impurity ions of the first conductivity type into the portion of the semiconductor substrate surrounded by the first well layer and the second ion-implanted region, said third ion-implanted region reaching a surface of the first well layer; and forming a second well layer and a third well layer by an annealing treatment of the second ion-implanted region and the third ion-implanted region after the second ion implantation and the third ion implantation, respectively, or after the third ion implantation simultaneously.

2. The method of claim 1, wherein the third ion implantation is carried out more than once.

3. The method of claim 1, wherein the annealing treatment for forming the first well layer also serves as an annealing treatment for forming a field oxide film on the semiconductor substrate.

4. The method of claim 1, wherein the second well layer is formed by the annealing treatment at about 950 to about 1100° C. for about 4 to about 6 hours.

5. The method of claim 1, wherein the third well layer is formed by the annealing treatment at about 950 to about 1100° C. for about 4 to about 6 hours.

6. The method of claim 1, wherein the third well layer shows an impurity concentration of about $1 \times 10^{16}$ to about $5 \times 10^{17}$ cm$^{-3}$ on the surface of the semiconductor substrate.

7. A method of manufacturing a semiconductor device, comprising the steps of:

(a) forming a buried first well region of a second conductivity type in a semiconductor substrate of a first conductivity type;

(b) forming a first implanted impurity region by selectively implanting impurities of the second conductivity type in said semiconductor substrate, wherein said first implanted impurity region and said buried first well region surround a portion of said semiconductor substrate and the implanting of impurities of the second conductivity type comprises implanting ions of the second conductivity type more than once, at least one of the dose and the implantation energy being different for two or more of the ion implantations;

(c) forming a second implanted impurity region by implanting impurities of the first conductivity type into the portion of said semiconductor substrate surrounded by said first implanted impurity region and said buried first well region, said second implanted impurity region reaching said buried first well region;

(d) forming second and third well regions by diffusing the impurities in the first and second implanted impurity regions using one or the other of: (1) respective first and second annealing treatments after steps (b) and (c), and (2) a single annealing treatment after step (c); and (e) forming a device which is part of a flash memory, said device including a MOS element formed in said third well region.

8. The method of claim 7, wherein the second and third wells are formed using the respective first and second annealing treatments, the first annealing treatment being conducted at about 950 to about 1100° C. for about 4 to about 6 hours and the second annealing treatment being conducted at about 950 to about 1100° C. for about 4 to about 6 hours.

9. The method of claim 7, wherein the second and third wells are formed using the single annealing treatment, the single annealing treatment being conducted at about 950 to about 1100° C. for about 4 to about 6 hours.

10. The method of claim 7, wherein ions of the second conductivity type are implanted three times under the following conditions: a dose of about $1.0 \times 10^{12}$ to about $5.0 \times 10^{12}$ cm$^{-2}$ with an implantation energy of about 150 to about 250 KeV; a dose of about $1.0 \times 10^{12}$ to about $5.0 \times 10^{12}$ cm$^{-2}$ with an implantation energy of about 850 to about 950 KeV; and a dose of about $1.0 \times 10^{12}$ to about $1.0 \times 10^{13}$ cm$^{-2}$ with an implantation energy of about 1.0 MeV to about 2.0 MeV.

11. The method of claim 7, wherein ions of the second conductivity type are implanted three times under the following conditions: a dose of about $2.0 \times 10^{12}$ cm$^{-2}$ with an implantation energy of about 200 KeV; a dose of about $2.0 \times 10^{12}$ cm$^{-2}$ with an implantation energy of about 900 KeV; and a dose of about $4.0 \times 10^{12}$ cm$^{-2}$ with an implantation energy of about 1.5 MeV.

12. The method of claim 7, wherein the step of implanting impurities of the first conductivity type comprises implanting ions of the first conductivity type more than once, at least one of the dose and the implantation energy being different for two or more of the ion implantations.

13. The method of claim 12, wherein ions of the first conductivity type are implanted three times under the following conditions: a dose of about $1.0 \times 10^{12}$ to about $5.0 \times 10^{12}$ cm$^{-2}$ with an implantation energy of about 100 to about 150 KeV; a dose of about $1.0 \times 10^{12}$ to about $1.0 \times 10^{13}$ cm$^{-2}$ with an implantation energy of about 250 to about 350 KeV; and a dose of about $1.0 \times 10^{12}$ to about $1.0 \times 10^{13}$ cm$^{-2}$ with an implantation energy of about 550 KeV to about 650 KeV.

14. The method of claim 13, wherein ions of the first conductivity type are implanted three times under the following conditions: a dose of about $3.0 \times 10^{12}$ cm$^{-2}$ with an implantation energy of about 120 KeV; a dose of about $5.0 \times 10^{12}$ cm$^{-2}$ with an implantation energy of about 300 KeV; and a dose of about $5.0 \times 10^{12}$ cm$^{-2}$ with an implantation energy of about 600 KeV.

15. A method of manufacturing a semiconductor device, comprising:

(a) forming a buried first well region of a second conductivity type in a semiconductor substrate of a first conductivity type;

(b) forming a first ion implanted impurity region having a multi-layer structure which extends between a surface of said semiconductor substrate and an upper surface of said buried first well region by selectively implanting impurity ions of the second conductivity type into said semiconductor substrate more than once;

(c) forming a second ion implanted impurity region having a multi-layer structure by implanting impurities of the first conductivity type into a portion of said semiconductor substrate surrounded by said first implanted region more than once, said second ion implanted impurity region reaching said buried well region;

(d) forming second and third well regions by diffusing the impurities in the first and second ion implanted impurity regions using one or the other of: (1) respective first and second annealing treatments after steps (b) and (c), and (2) a single annealing treatment after step (c), said third well region being surrounded by said buried first well region and said second well region; and (e) forming a semiconductor device on said semiconductor substrate, said semiconductor device including at least one element formed in said third well region.

16. The method of claim 15, wherein ions of the second conductivity type are implanted three times under the following conditions: a dose of about $1.0 \times 10^{12}$ to about $5.0 \times 10^{12}$ cm$^{-2}$ with an implantation energy of about 150 to about 250 KeV; a dose of about $1.0 \times 10^{12}$ to about $5.0 \times 10^{12}$ cm$^{-2}$ with an implantation energy of about 850 to about 950 KeV; and a dose of about $1.0 \times 10^{12}$ to about $1.0 \times 10^{13}$ cm$^{-2}$ with an implantation energy of about 1.0 MeV to about 2.0 MeV.

17. The method of claim 15, wherein ions of the first conductivity type are implanted three times under the following conditions: a dose of about $1.0 \times 10^{12}$ to about $5.0 \times 10^{12}$ cm$^{-2}$ with an implantation energy of about 100 to about 150 KeV; a dose of about $1.0 \times 10^{12}$ to about $1.0 \times 10^{13}$ cm$^{-2}$ with an implantation energy of about 250 to about 350 KeV; and a dose of about $1.0 \times 10^{12}$ to about $1.0 \times 10^{13}$ cm$^{-2}$ with an implantation energy of about 550 KeV to about 650 KeV.

18. The method of claim 15, wherein said semiconductor device is a semiconductor memory device.

* * * * *